United States Patent [19]
Uno et al.

[11] Patent Number: 5,123,036
[45] Date of Patent: Jun. 16, 1992

[54] X-RAY EXPOSURE APPARATUS

[75] Inventors: Shinichiro Uno, Atsugi; Yutaka Watanabe, Isehara; Noritaka Mochizuki, Yokohama; Ryuichi Ebinuma, Kawasaki; Yasuaki Fukuda, Hadano, all of Japan

[73] Assignee: Canon Kabushiki Kaisha, Tokyo, Japan

[21] Appl. No.: 735,691

[22] Filed: Jul. 22, 1991

Related U.S. Application Data

[63] Continuation of Ser. No. 599,837, Oct. 19, 1990, abandoned.

[30] Foreign Application Priority Data

Oct. 19, 1989 [JP] Japan .................. 1-270439
Oct. 5, 1990 [JP] Japan .................. 2-267644

[51] Int. Cl.⁵ .............................. G21K 5/00
[52] U.S. Cl. ......................... 378/34; 378/84
[58] Field of Search ........... 378/34, 43, 84, 119; 250/492.2; 355/60; 350/629, 630, 628, 443

[56] References Cited

U.S. PATENT DOCUMENTS 4,028,547  6/1977  Eisenberger .............. 250/272
4,631,743 12/1986  Tominass et al. ......... 378/119
5,003,567  3/1991  Hawryluk et al. ......... 378/34

FOREIGN PATENT DOCUMENTS 226122 11/1985 Japan .
244400  9/1989 Japan .

OTHER PUBLICATIONS

Grobman, "Synchrotron Radiation X-Ray Lithography," Handbook on Synchrotron Radiation, vol. 1, 1983, pp. 1131 through 1136.

Primary Examiner—Janice A. Howell
Assistant Examiner—David P. Porta
Attorney, Agent, or Firm—Fitzpatrick, Cella, Harper & Scinto

[57] ABSTRACT

An X-ray exposure apparatus for exposing a resist on a substrate to a pattern of an original includes a radiation source for providing X-rays; and an illumination system for irradiating the original and the substrate with the X-rays such that the resist of the substrate is exposed to the pattern of the original with the X-rays; wherein the illumination system has a convex mirror having a reflection surface of a shape like a cylindrical surface, for reflecting the X-rays from the radiation source to the original; and wherein the reflection surface of the mirror has such an aspherical surface shape that, with respect to a top of the reflection surface, a radiation source side and an original side are asymmetrical in shape, that, in the neighborood of the top, the radiation source side has a radius of curvature smaller than that of the original side, and that at a peripheral potion the reflection surface has a curvature of a radius larger than that at the top of the reflection surface.

17 Claims, 6 Drawing Sheets

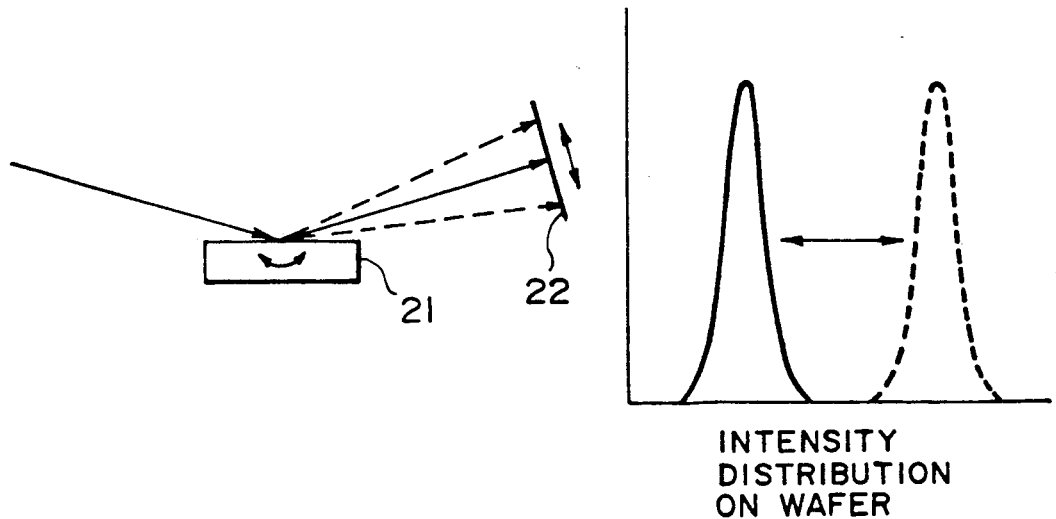
FIG. IA
PRIOR ART
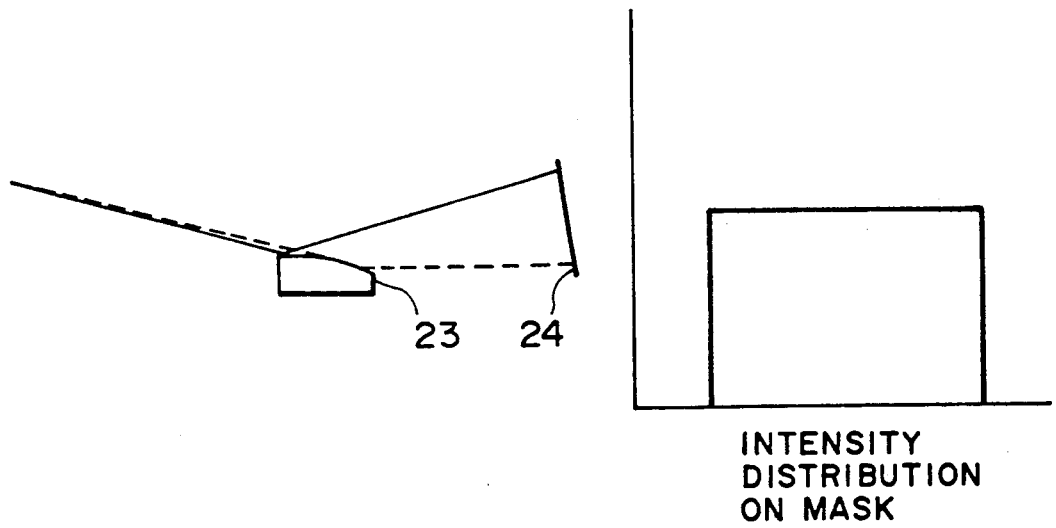
FIG. IB
PRIOR ART

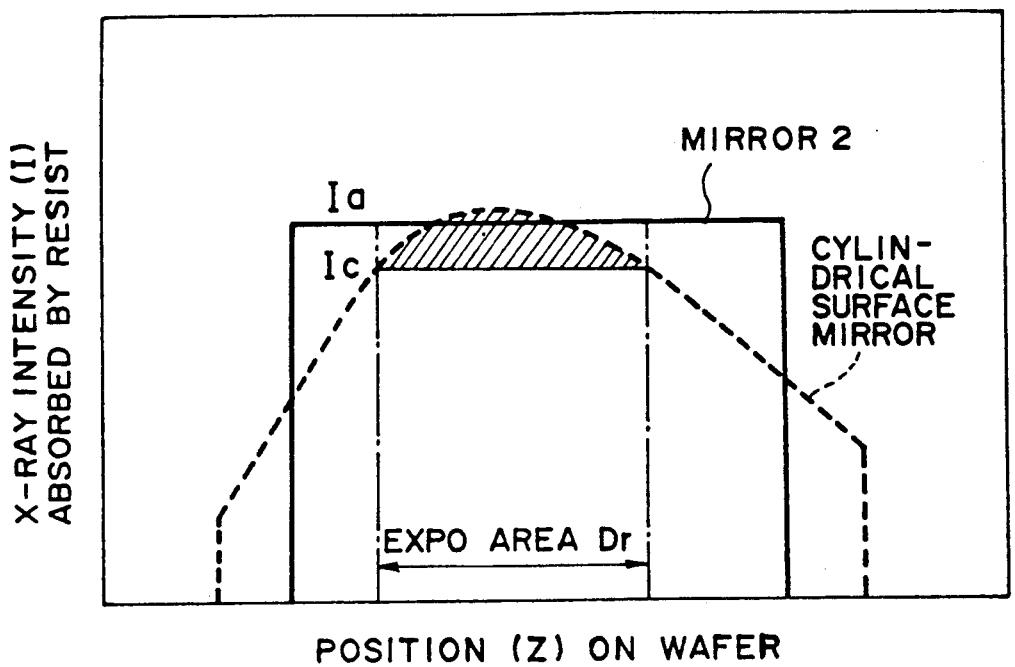
F I G. 3
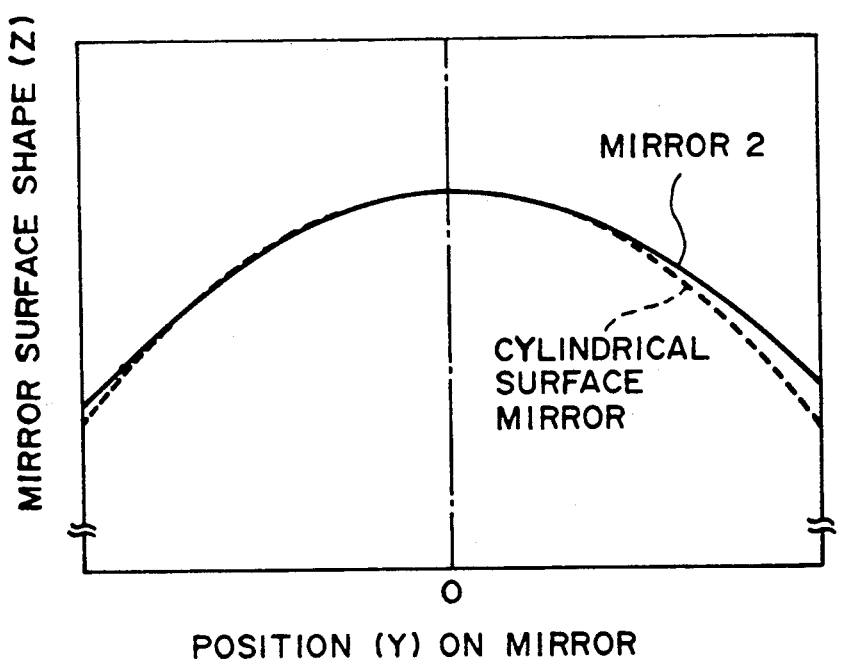
F I G. 4

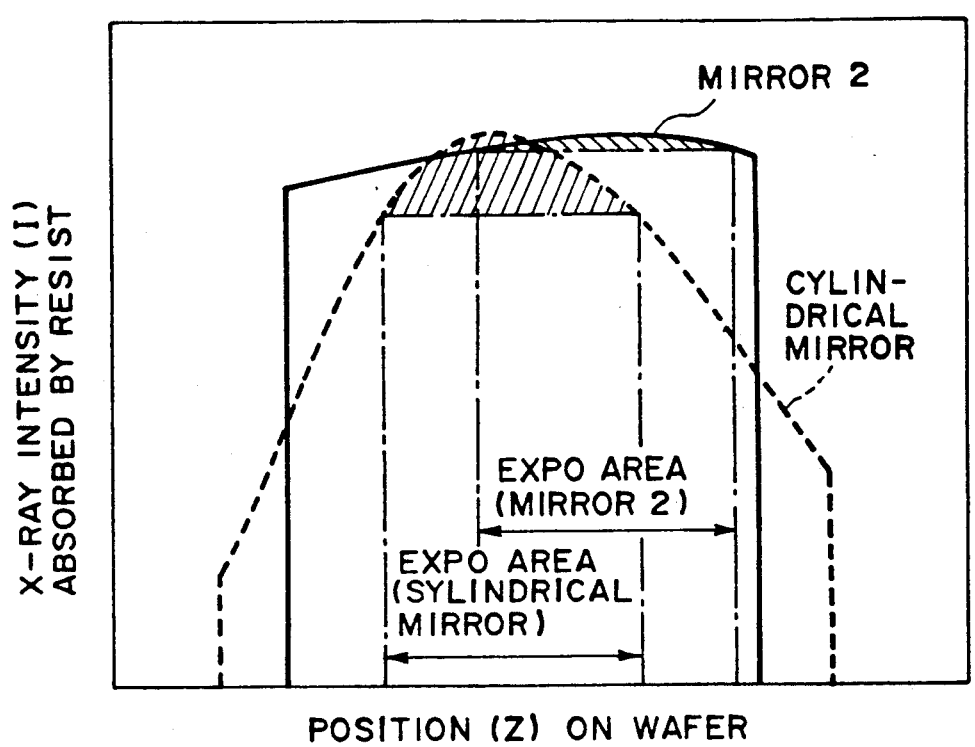
F I G. 7
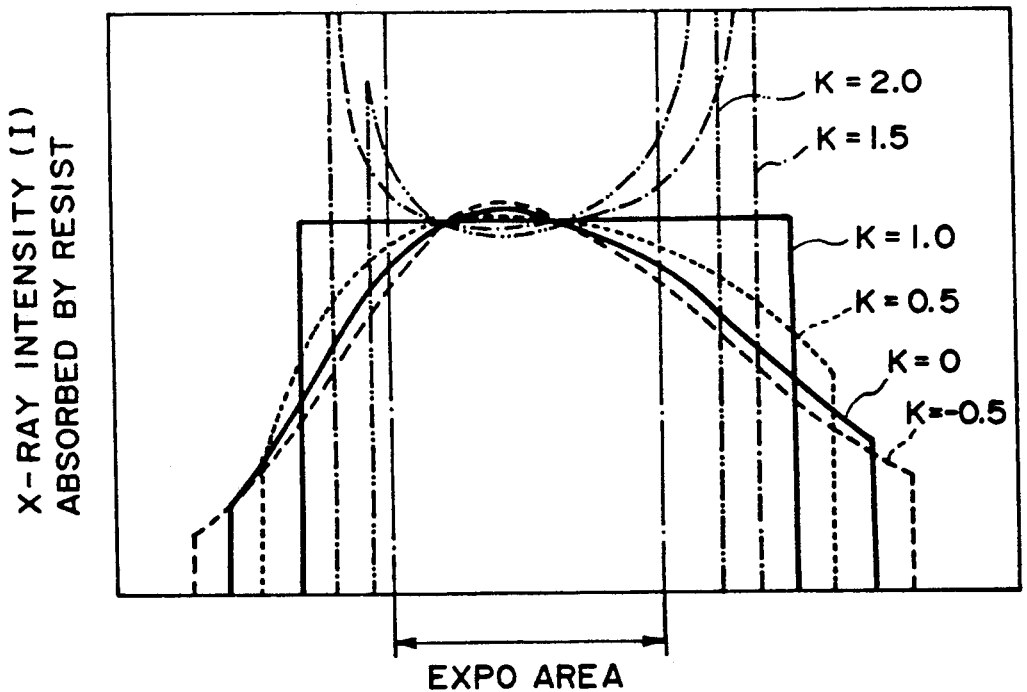
F I G. 8

X-RAY EXPOSURE APPARATUS

This application is a continuation of application Ser. No. 07/599,837 filed Oct. 19, 1990, now abandoned.

FIELD OF THE INVENTION AND RELATED ART

This invention relates to an X-ray exposure apparatus for use in the manufacture of semiconductor devices, for transferring a pattern of an original such as a reticle to a semiconductor substrate such as a wafer by using an X-ray source such as a synchrotron orbit radiation (SOR) source.

In such an X-ray exposure apparatus, when an SOR source is used as an X-ray source, since the light from the SOR source consists of sheet-like electromagnetic waves having a large divergence angle in a direction parallel to the electron orbit plane, but having a small divergence angle in a direction perpendicular to the electron orbit plane, if the light from the SOR source is directly projected to an original, with respect to the aforementioned perpendicular direction only a limited area of the original can be illuminated. This necessitates some measures for expanding the SOR light (X-rays) in the perpendicular direction, when the X-ray exposure apparatus uses an SOR source as an X-ray source.

An Example is shown in FIG. 1A wherein a grazing incidence mirror (flat mirror) 21 is disposed between an SOR source and an exposure area of a wafer 22, and the mirror 21 is oscillated by a small angle of a few milliradians to expand the light from the SOR source, as discussed in "JVST", B1 (4), 1983, p. 1271. A second example is shown in FIG. 1B wherein a mirror 24 having a sectional shape which can be represented by an exponential function is provided to expand the SOR light having a Gaussian distribution, with respect to the perpendicular direction, and also to make the intensity distribution uniform, as disclosed in Japanese Laid-Open Patent Application, Laid-Open No. 60-226122. In FIG. 1A, the graph at the right-hand half depicts the intensity distribution of X-rays as absorbed by a resist applied to the wafer, in the first example. In FIG. 1B, the graph at the right-hand half depicts the intensity distribution of X-rays on the mask surface, in the second example.

In the first method described above, at any moment only a part of the mask is irradiated. Thus, there is a high possibility of local thermal expansion of the mask during the exposure process, which leads to pattern transfer distortion. In order to avoid the affect of such thermal expansion, the oscillation period of the mirror 21 has to be made sufficiently small, and this requires use of a large driving power for oscillating the mirror 21. Also, the necessary mechanism of the driving means for the mirror 21 is complicated and, therefore, this method is not too practical.

In the second method described above, non-uniformness in the intensity of the SOR light can be reduced by the reflection with the mirror 24. However, as the SOR light passing through the mask is absorbed by the resist, the absorption rate of the resist has wavelength-dependence and, generally, the SOR light is not a monochromatic light. Therefore, non-uniformness in exposure occurs in the resist itself. Further, the mirror 24 is equipped with only such a reflection surface which corresponds to a half of a cylindrical surface on one side of its top. As a result, only a portion of the SOR light which is at the upper side or lower side of the electron orbit plane can be used. Thus, the efficiency of utilization is bad.

SUMMARY OF THE INVENTION

It is accordingly, a primary object of the present invention to provide an X-ray exposure apparatus by which a resist on a substrate can be exposed with a small loss of energy, uniformly without non-uniformness in intensity.

In accordance with a first aspect of the present invention, to achieve this object, there is provided an X-ray exposure apparatus for exposing a resist on a substrate to a pattern of an original, comprising: a radiation source for providing X-rays; and an illumination system for irradiating the original and the substrate with the X-rays such that the resist of the substrate is exposed to the pattern of the original with the X-rays; wherein said illumination system has a convex mirror having a reflection surface of a shape like a cylindrical surface, for reflecting the X-rays from said radiation source to the original; and wherein said reflection surface of said mirror has such an aspherical surface shape that, with respect to a top (vertex) of said reflection surface, a radiation source side and an original side are asymmetrical in shape, that, in the neighborhood of said top, the radiation source side has a radius of curvature smaller than that of the original side, and that at a peripheral portion said reflection surface has a curvature of a radius larger than that at said top of said reflection surface.

In accordance with a second aspect of the present invention, to achieve the above object, there is provided an X-ray exposure apparatus for exposing a resist on a substrate to a pattern of an original, comprising: a radiation source for providing X-rays; and an illumination system for irradiating the original and the substrate with the X-rays such that the resist of the substrate is exposed to the pattern of the original with the X-rays; wherein said illumination system has a convex mirror having a convex reflection surface of a shape like a cylindrical surface, for reflecting the X-rays from said radiation source to the original; wherein said reflection surface of said mirror has such an aspherical surface shape that, with respect to a top of said reflection surface, a radiation source side and an original side are asymmetrical in shape; wherein, in the neighborhood of said top, said reflection surface has a particular radius of curvature; wherein a particular quantity is set with respect to an X-ray beam reflected by said top and then absorbed by the resist; wherein, when a y coordinate is defined along an axis corresponding to a tangent to said top while taking said top as an origin, the surface shape of said reflection surface is represented by a function $Z(y)$; and wherein specific conditions are satisfied with regard to the surface shape of the reflection mirror so as to ensure substantially uniform distribution of the X-ray absorption quantity of the resist on the substrate.

In accordance with a third aspect of the present invention, to achieve the above object, there is provided an X-ray exposure apparatus for exposing a resist on a substrate to a pattern of an original, comprising: a synchrotron radiation source for providing X-rays; and an illumination system for irradiating the original and the substrate with the X-rays such that the resist of the substrate is exposed to the pattern of the original with the X-rays; wherein said illumination system has a convex mirror having a reflection surface of a shape like a cylindrical surface, for reflecting the X-rays from said radiation source to the original; wherein said reflection surface of said mirror has such an aspherical surface shape that, with respect to a top of said reflection surface, a radiation source side and an original side are asymmetrical in shape; wherein, in the neighborhood of said top, said reflection surface has a particular radius of curvature; wherein a particular quantity is set with regard to an X-ray beam reflected by said top and then absorbed by the resist; wherein, when a y coordinate is defined along an axis corresponding to a tangent to said top while taking said top as an origin, the surface shape of said reflection surface is represented by a function $Z(y)$; and wherein specific conditions, different from those mentioned above, are substantially satisfied so as to ensure sufficiently uniform distribution of the X-ray absorption quantity of the resist on the substrate.

In the second and third aspects, the reflection surface of the reflection mirror is shaped so that the radius of curvature at a peripheral portion (a portion off the optical axis and spaced from the top) is larger than that in the neighborhood of the top (adjacent to the optical axis). As a result, a beam of a peripheral part of the X-ray flux which impinges on a peripheral portion of the mirror can be directed to the original and the substrate with good efficiency. Namely, it is possible to use, for the exposure, such a peripheral part of the beam which could not be used for the exposure in an arrangement wherein a simple cylindrical reflection surface is used to reflect the X-rays to the original and the substrate.

As for the structure of such a mirror, a substrate of SiC, a substrate of $SiO_2$ or a substrate of $SiO_2$ with Au deposition or, alternatively, a substrate of $SiO_2$ with Pt deposition, can be used.

Thus, with the present invention, it becomes possible to expose a resist on a substrate uniformly, while reducing the loss of X-ray energy and, therefore, it is possible to accurately transfer a pattern of an original onto the resist of the substrate. Additionally, it is possible to reduce the exposure time.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are representations for explaining known examples of an X-ray exposure system.

FIG. 3 is a graph showing the X-ray absorption distribution of a resist on a wafer, in the exposure apparatus of the FIG. 2A embodiment, and the X-ray absorption distribution of a resist on a wafer in an exposure apparatus having a cylindrical reflection surface.

FIG. 4 is a graph showing the shape of the reflection surface of the mirror of the FIG. 2A exposure apparatus, and the shape of a reflection surface of a cylindrical reflection mirror.

FIG. 7 is a graph showing the X-ray absorption distribution as obtainable in the exposure apparatus of FIG. 2A when the resist shown in FIG. 6 is used, and the X-ray absorption distribution as obtainable in an exposure apparatus having a mirror with a cylindrical reflection surface when the same resist is used.

FIG. 8 is a graph showing the X-ray absorption distribution of a resist as obtainable with different shapes of mirror reflection surfaces, in the exposure apparatus of the FIG. 2A embodiment.

DESCRIPTION OF THE PREFERRED EMBODIMENTS

Figure 2A:
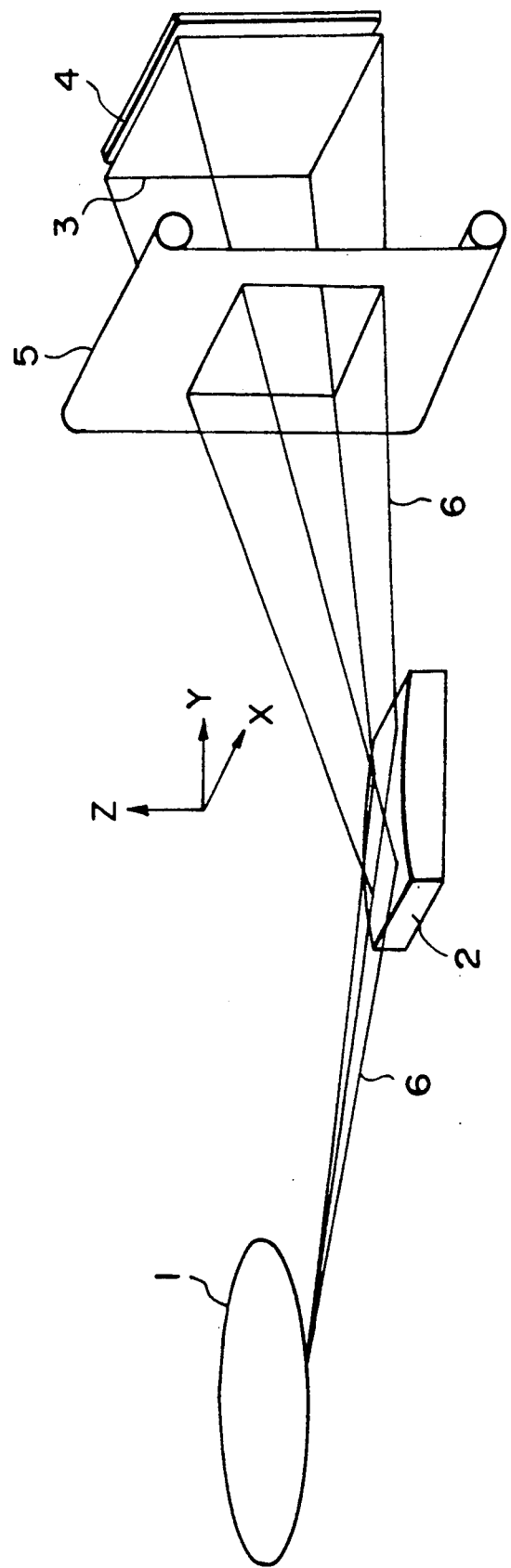
FIG. 2A is a perspective view, schematically showing an X-ray exposure apparatus according to an embodiment of the present invention.
Figure 2B:
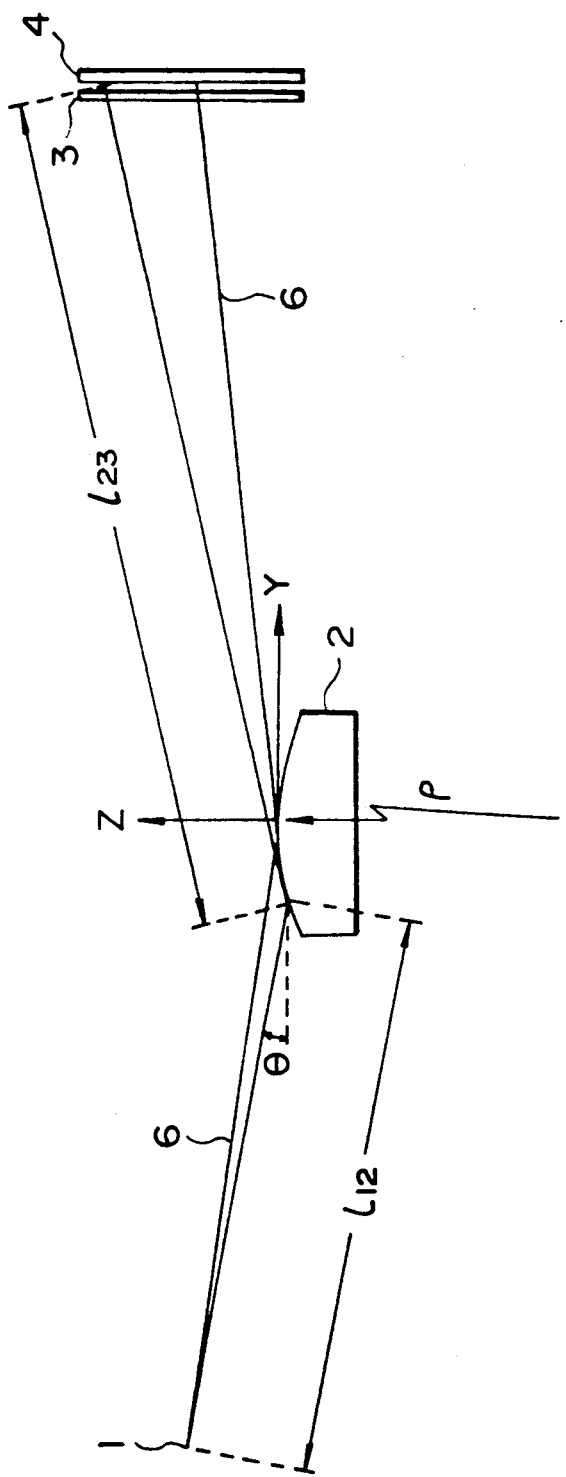
FIG. 2B is a sectional view of the exposure apparatus of the FIG. 2A embodiment.

Referring to FIGS. 2A and 2B showing an X-ray exposure apparatus according to an embodiment of the present invention, denoted at 1 is a synchrotron which is adapted to emit synchrotron radiation light (SOR light). The synchrotron 1 has a horizontal orbit plane which is parallel to the X-Y plane. The synchrotron 1 emits, toward a mirror 2, a sheet-like flux 6 of X-rays having a small width with respect to the Z direction and a large width with respect to a direction parallel to the X-Y plane. The mirror 2 is a convex mirror, the reflection surface of which has an aspherical surface shape and is based on a cylindrical reflection surface, to be described below.

The mirror 2 has a generating line which extends in the X direction. A perpendicular to the top (vertex) of the reflection surface of the mirror 2, extends in the Z direction. In the section along the Z-Y plane, the mirror 2 has a predetermined shape deformed slightly from a cylindrical shape. More particularly, with respect to the top of the reflection surface, the synchrotron 1 side and a side opposite thereto (i.e. the mask 3 side) are asymmetrical in shape. Further, in the neighborhood of the top, the radius of curvature at the synchrotron 1 side is set to be smaller than that at the mask side.

The reflection surface of the mirror 2 reflects the X-rays 6 from the synchrotron 1, and while expanding the beam diameter and transforming the sectional intensity distribution thereof into a predetermined distribution, the mirror 2 directs the X-rays to the mask 3. The X-rays 6 from the mirror 2 pass through a shutter 5 and illuminate a circuit pattern of the mask 3. Those of the X-rays passing through the circuit pattern of the mask impinge on a wafer 4. By those X-rays 6, a resist applied to the wafer 4 surface is exposed in accordance with the circuit pattern of the mask 3. The surfaces of the shutter 5, the mask 3 and the wafer 4, receiving the X-rays, are placed substantially parallel to the Z-Y plane. The mirror 2 may comprise a substrate of SiC having a machined convex reflection surface, a substrate of $SiO_2$ having a machined convex reflection surface, a substrate of $SiO_2$ having a machined convex reflection surface on which Au is deposited, a substrate of $SiO_2$ having a machined convex reflection surface on which Pt is deposited, or the like.

Referring to FIG. 3, a solid line depicts the X-ray absorption distribution (a distribution of the quantity (intensity) X-ray absorption per unit time), with respect to the Z direction, of the resist on the wafer 4 as the wafer 4 is exposed by using the exposure apparatus of FIGS. 2A and 2B. Also, in FIG. 3, a broken line depicts the X-ray absorption distribution with respect to the Z direction, as a wafer 4 is exposed by using a mirror having a cylindrical reflection surface, in place of the mirror 2.

Referring to FIG. 4, a solid line depicts the sectional shape of the mirror 2 of the exposure apparatus of FIGS. 2A and 2B. Also, a broken line depicts the sectional shape of the aforementioned mirror having the cylindrical reflection surface.

If such a mirror having a cylindrical reflection surface is used for exposure, as depicted by the broken line in FIG. 3, the X-ray absorption distribution obtained is non-uniform. In order to correct such non-uniformness, it is necessary to use some measures to block the X-rays corresponding to the hatched area in FIG. 3. If such a method for partially blocking the X-rays is used, the quantity of X-ray absorption per unit time is reduced to a lower level, such as Ic shown in FIG. 3.

With the mirror 2 of the present embodiment, as compared therewith, it is possible to attain the quantity of X-ray absorption per unit time, of a high level Ia which is higher than Ic. Additionally, over the whole exposure region on the resist, the X-ray absorption distribution is uniform. Thus, with the exposure apparatus of the present embodiment, it is possible to accomplish uniform exposure in a reduced time.

Details of the mirror 2 of the present embodiment will be explained below.

The quantity I(z) of X-ray absorption of the resist on the wafer 4, at a certain portion along the Z direction, can be expressed by the following equation:

$$I(z) = 1/C \cdot \left[ \int_0^\infty I_1(\lambda) \cdot R(\lambda) \cdot Tw(\lambda) \cdot T_3(\lambda) \cdot A_4(\lambda) d\lambda \right] \quad (1)$$

wherein $$C = [1 + (l_{23}/l_{12}) \cdot (1 + 2l_{12}/\rho \sin\theta)] \times (l_{12} + l_{23})/l_{12} \quad (2)$$

where $\lambda$ is the wavelength of the X-rays 6; $I_1(\lambda)$ is the intensity of the X-rays 6 impinging on the mirror 2; $R(\lambda)$ is the reflectivity of the mirror 2; $Tw(\lambda)$ is the transmittance as provided when a beryllium window or a filter is used; $T_3(\lambda)$ is the transmittance of the mask 3; $A_4(\lambda)$ is the absorption rate of the resist 4; and C is the expansion rate of the X-ray 6 (i.e., "beam area on the wafer 4"/"beam area on the mirror 2", of the mirror 2, as determined by the curvature radius $\rho$ at each point on the mirror 2 surface, the distance $l_{12}$ between the light emission center of the synchrotron 1 and each point on the mirror 2, the distance $l_{23}$ between each point on the mirror 2 and each corresponding point (z) on the resist of the wafer 4, and the angle of incidence ($\theta$) of an X-ray beam impinging on each point on the mirror 2.

Here, the quantity (intensity) of X-ray as absorbed per unit time by the resist of the wafer 4 is determined as Ia, on the basis of the nature of the resist used and the intensity of the X-rays 6. For example, based on the X-ray absorption distribution such as depicted by the broken line in FIG. 3 which is obtainable when the resist is exposed by using a mirror having a cylindrical reflection surface, the quantity of X-rays absorbed by the resist is integrated, with respect to the Z direction, from an end of the illumination region to the other end, and an integrated level Ir is obtained. Then, the integrated level Ir is divided by the length Ar of the illumination region in the Z direction, by which Ia can be determined as Ia=Ir/Ar. Here, if the length of the exposure area in the Z direction is denoted by Dr, it is necessary that the length Ar of the illumination region is made larger than the length Dr of the exposure area. Also, if the former is too large, the intensity of X-rays (the X-ray quantity to be used for the exposure) decreases. In consideration of these points, preferably the structure is arranged to satisfy the relation that Dr<Ar<3Dr.

After the quantity Ia of X-ray absorption per unit time is determined, the curvature radius $\rho_0$ (unknown quantity) of the mirror 2 at a portion adjacent the top (vertex) thereof is determined. To this end, I=Ia and $\rho=\rho_0$ are substituted into equations (1) and (2), and calculations are made in accordance with these equations. If Ia and $\rho_0$ are determined in this manner and the quantity $I_0$ of X-rays reflected by the top of the mirror 2 and absorbed by (the center of ) the exposure area of the resist is determined as $I_0$=Ia, then the curvature radius $\rho=\rho(y)$ at each point on the reflection surface of the mirror 2 can be determined in accordance with the following equation:

$$1/\rho = \{l_{12}/[l_{23}(l_{12} + l_{23})] \cdot C - (l_{12} + l_{23})/(l_{12} \cdot l_{23})\} \times \sin\theta/2 \quad (3)$$

wherein $$C = I/I_0 \cdot [1 + (l_{23}/l_{12})(1 + 2l_{12}/\rho_0 \sin\theta)] \times (l_{12} + l_{23})/l_{12} \quad (4)$$

where $l_{12}$, $l_{23}$ and $\theta$ are those corresponding to the variables in equations (1) and (2), and I is the quantity of X-ray absorption per unit time at each point (z) on the resist of the wafer 4, as the resist is exposed with an X-ray beam reflected at each point (y) on the mirror with a cylindrical reflection surface having a curvature radius $\rho_0$.

Figure 5:
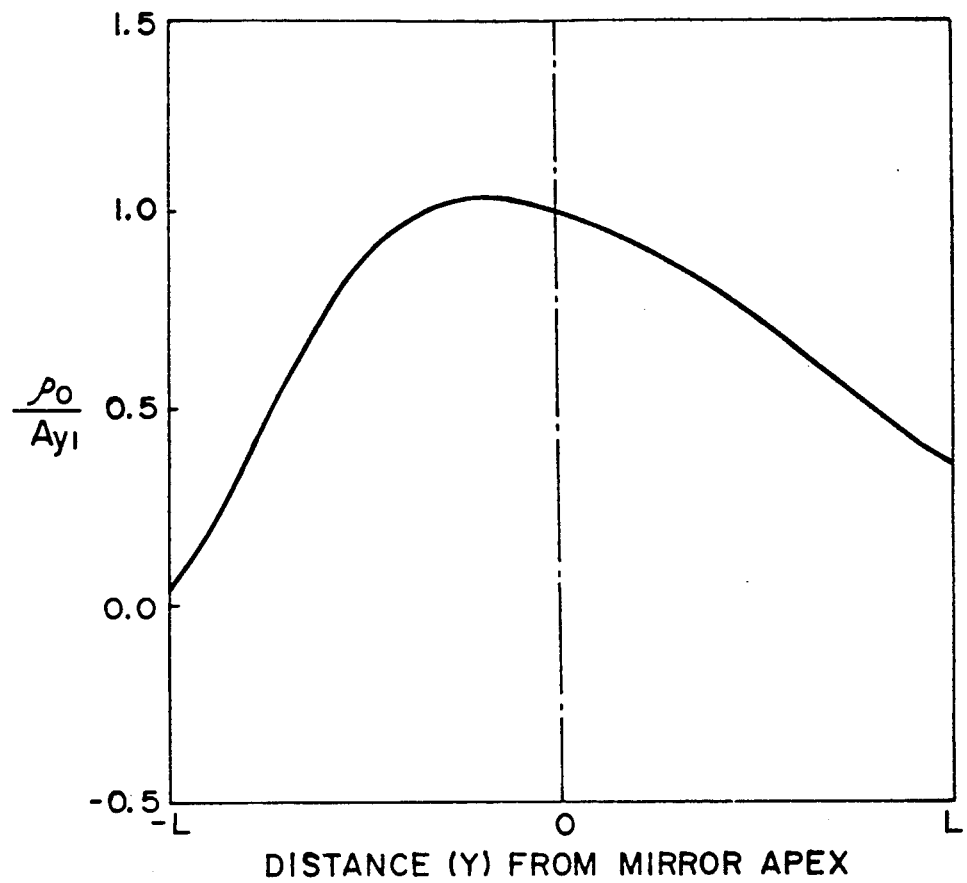
FIG. 5 is a graph showing the ratio between the radius of curvature in the neighborhood of the top of the reflection mirror of the FIG. 2A exposure apparatus and the radius of curvature at each point off the optical axis.

In the present embodiment, $I_0$ and $\rho_0$ are set beforehand and, in accordance with equations (3) and (4), the curvature at each point (y) of the reflection surface of the mirror 2 is determined successively, in an order from the vertex of the mirror 2 to the end, so as to assure that the X-ray absorption distribution of the resist in the exposure area becomes uniform such as depicted by the solid line in FIG. 3. FIG. 5 shows the change in the curvature $\rho(y)$, wherein $\rho_0/\rho(y)$ is taken on the axis of the ordinate. In FIG. 5, the sign of the curvature $\rho(y)$ is illustrated as being positive ($\rho(y)>0$) when the curvature center is below the mirror 2 surface, while the sign of the curvature $\rho(y)$ is illustrated as being negative ($\rho(y)<0$) when the curvature center is above the mirror 2 surface. However, it will be readily understood from the drawing that in the present embodiment the shape of the reflection surface of the mirror 2 is determined in accordance with a range $-0.5<\rho_0/\rho(y)<1.5$ and, additionally, $\rho_0/\rho(y)>0$ is satisfied.

In the present embodiment, the reflection surface of the mirror 2 has such a shape that, with spacing from the top of the mirror 2, the surface gradually shifts from a cylindrical reflection surface having the same curvature radius as the curvature radius ($\rho_0$ at the portion adjacent the top (vertex) of the mirror 2). The curvature radius at a point off the optical axis and sufficiently spaced from the vertex, is larger than the curvature radius $\rho_0$ in the neighborhood of the vertex. Also, in order to ensure uniform X-ray absorption distribution of the resist in the exposure area, the left-hand and right-hand sides of the vertex of the reflection surface have asymmetrical shapes.

The mirror 2 so shaped has a function for collecting peripheral portions of the X-ray flux from the synchrotron 1, which portions are off the axis and which cannot be used for the exposure conventionally, toward the wafer 4 as well as a function for providing uniform X-ray absorption distribution of the resist on the wafer 4. As a result, it is possible to reduce the exposure time and also to assure uniform exposure, that is, accurate pattern transfer. As regards the uniformness of the X-ray absorption distribution, desirably it is such that the non-uniformness is not greater than 2%, preferably, not greater than 0.2%.

Advantageous effects of the present embodiment will be explained by using specific numerical values.

For determination of the intensity Ia of resist absorption, the integrated intensity Ir' as absorbed by the resist is determined as 23 mW/cm$^3$. Here, the mirror material is SiO$_2$, the mask material is Si$_3$N$_4$, the resist material is PMMA and the angle of incidence of the center beam is 10 mrad.

Here, if the exposure area has a size of 3 cm square while the illumination area has a size of 6 cm square, then the quantity Ia of X-ray absorption can be determined by:

$$Ia = I_0 = 24/6 = 4.0 \ (mW/cm^2)$$

Here, the curvature radius $\rho_0$ of the mirror 2 in the neighborhood of the top thereof is 50 m, for example, and the shape of the reflection surface can be determined in accordance with equations (3) and (4). As compared therewith, if a mirror with a cylindrical reflection surface having a curvature radius of 50 m is used, at the opposite ends of the exposure area, the quantity Ic of X-ray absorption was 3.5 mW/cm$^2$.

As described, with the mirror 2 of the present embodiment, as compared with a mirror having a cylindrical reflection surface of the same curvature radius, the quantity of X-ray absorption is increased by 15%. Thus, with a simple comparison with respect to the intensity, the exposure time can be reduced to 87% of that as required by a mirror having a cylindrical reflection surface.

Figure 6:
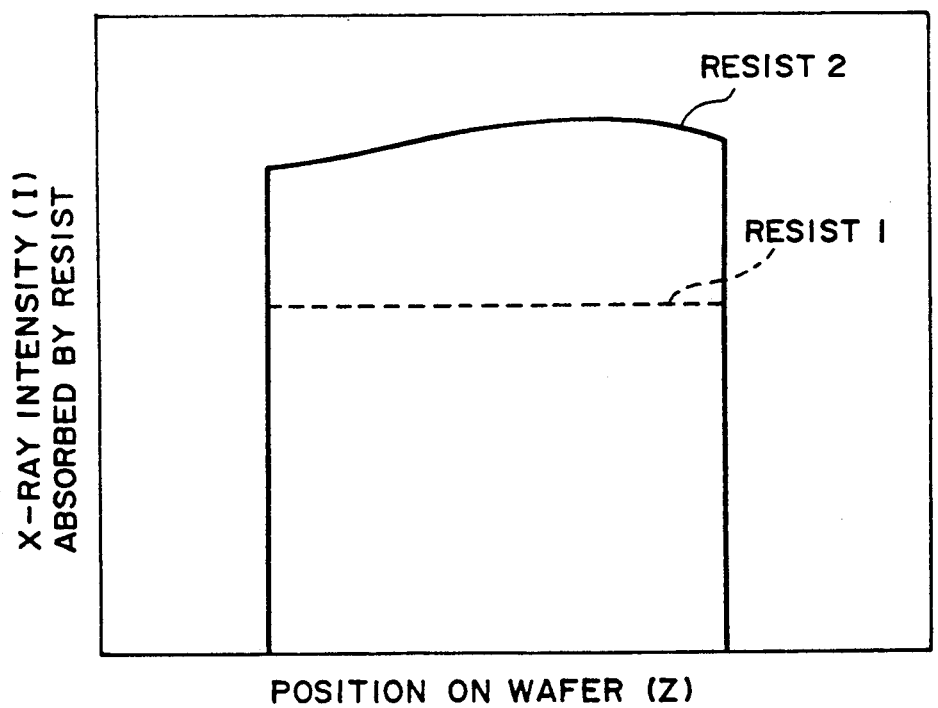
FIG. 6 is a graph showing the X-ray absorption distribution of a different resist when it is used in the exposure apparatus of FIG. 2A.

FIG. 6 illustrates the results of comparison, with respect to the X-ray absorption distribution, between the resist used in this embodiment and a different type resist. In FIG. 6, a broken line depicts the distribution as obtained with the resist (resist 1) used in the present embodiment, while a solid line depicts the distribution as obtained with a different type resist (resist 2). It is seen from the drawing that, with a different resist, a different distribution is provided, and there is a possibility of non-uniformness (hatched area). However, as shown in FIG. 7, the non-uniformness resulting from the different resist (resist 2) is 3% at the maximum, and this is very small as compared with the non-uniformness of 15% in the case using a mirror having a cylindrical reflection surface. Thus, with a simple comparison with respect to the intensity, the exposure time can be reduced to 89% of that as required when the mirror with a cylindrical reflection surface is used.

The concept of increasing the intensity and resultant reduction of exposure time, based on use of an aspherical surface shape of the reflection mirror, is not limited to a form satisfying equations (3) and (4). There is a certain effective range. That is, when the surface shape of the mirror that satisfies equations (3) and (4) is denoted by $Z_p(y)$ and the surface shape of a mirror with a cylindrical reflection surface having a curvature radius $\rho_0$, which is a basic curved surface on which the mirror of the present embodiment is based, is denoted by $Z_0(y)$, then the effective surface shape $Z(y)$ can be represented by:

$$Z(y) = Z_0(y) + K(Z_p(y) - Z_0(y)) \quad (5)$$

wherein $$0 < K \leq 1.5 \quad (6)$$

FIG. 8 shows the quantity (intensity) distribution of X-rays that are absorbed by the resist, with different values for "K". "K=0" corresponds to the cylindrical reflection surface, while "K=1" corresponds to the surface shape of the mirror. It is to be noted here that $Z_0(y)$ can be expressed, while taking the origin on the vertex, as follows:

$$Z_0(y) = \sqrt{\rho_0^2 - y^2} - \rho_0 \quad (7)$$

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus for exposing a resist on a substrate to a pattern of an original, comprising:
    a radiation source for providing X-rays; and
    an illumination system for irradiating the original and the substrate with the X-rays such that the resist of the substrate is exposed to the pattern of the original with the X-rays;
    wherein said illumination system has a convex mirror having a convex reflection surface of a shape like a cylindrical surface, for reflecting the X-rays from said radiation source to the original;
    wherein said reflection surface of said mirror has such an aspherical surface shape that, with respect to a top of said reflection surface, a radiation source side and an original side are asymmetrical in shape;
    wherein, in the neighborhood of said top, said reflection surface has a radius of curvature $\rho_0$;
    wherein a set quantity of an X-ray beam reflected by said top and then absorbed by the resist is $I_0$;
    wherein, when a y coordinate is defined along an axis corresponding to a tangent to said top while taking said top as an origin, the surface shape of said reflection surface is represented by a function $Z(y)$; and
    wherein equations (1)–(5) below are substantially satisfied:

$$Z(y) = Z_0(y) + K(Z_p(y) - Z_0(y)) \quad (1)$$

$$0 < K \leq 1.5 \quad (2)$$

$$1/\rho = \{l_{12}/[l_{23}(l_{12} + l_{23})] \cdot C - (l_{12} + l_{23})/(l_{12} \cdot l_{23})\} \times \sin\theta/2 \quad (3)$$

-continued $$C = I/I_0 \cdot [1 + (l_{23}/l_{12})(1 + 2l_{12}/\rho_0 \sin\theta)] \cdot (l_{12} + l_{23})/l_{12} \quad (4)$$

$$Z_0(y) = \sqrt{\rho_0^2 - y^2} - \rho_0 \quad (5)$$

where $z_0(y)$ is the function which represents the surface shape of a cylindrical reflection surface of a curvature radius $\rho_0$, corresponding to a basic curved surface on which the reflection surface of said mirror is based, $Z_\rho(y)$ is a function which represents the surface shape of the reflection surface of said mirror that substantially satisfies the conditions (3) and (4), $\rho$ is the curvature radius at each point on the reflection surface of said mirror along the coordinate, $\theta$ is the angle of incidence of each X-ray beam impinging on each point on the reflection surface of said mirror along the coordinate, $l_{12}$ is the distance between the emission center of said radiation source and each point on the reflection surface of said mirror along the coordinate, $l_{23}$ is the distance between each point on the reflection surface of said mirror along the coordinate and the point of incidence on the resist of each beam reflected by each point on the reflection surface, and I is the quantity of each X-ray beam as reflected by each point on the reflection surface along the coordinate and absorbed by the resist, as the resist is exposed with the X-rays reflected by the reflection surface having a surface shape of $Z_0(y)$.

2. An apparatus according to claim 1, wherein a relation $K = 1$ is set.

3. An apparatus according to claim 1, wherein said radiation source comprises a synchrotron radiation source.

4. An X-ray exposure apparatus for exposing a resist on a substrate to a pattern of an original, comprising:
a radiation source for providing X-rays; and
an illumination system for irradiating the original and the substrate with the X-rays such that the resist of the substrate is exposed to the pattern of the original with the X-rays;
wherein said illumination system has a convex mirror having a reflection surface of a shape like a cylindrical surface, for reflecting the X-rays from said radiation source to the original; and
wherein said reflection surface of said mirror has such an aspherical surface shape that, with respect to a top of said reflection surface, a radiation source side and an original side are asymmetrical in shape, that, in the neighborhood of said top, the radiation source side has a radius of curvature smaller than that of the original side, and that at a peripheral portion said reflection surface has a curvature of a radius larger than that at said top of said reflection surface.

5. An apparatus according to claim 4, wherein said radiation source comprises a synchrotron.

6. An X-ray exposure apparatus for exposing a resist on a substrate to a pattern of an original, comprising:
a synchrotron radiation source for providing X-rays; and
an illumination system for irradiating the original and the substrate with the X-rays such that the resist of the substrate is exposed to the pattern of the original with the X-rays;
wherein said illumination system has a convex mirror having a reflection surface of a shape like a cylindrical surface, for reflecting the X-rays from said radiation source to the original;
wherein said reflection surface of said mirror has such an aspherical surface shape that, with respect to a top of said reflection surface, a radiation source side and an original side are asymmetrical in shape;
wherein, in the neighborhood of said top, said reflection surface has a radius of curvature $\rho_0$;
wherein a set quantity of an X-ray beam reflected by said top and then absorbed by the resist is $I_0$;
wherein, when a y coordinate is defined along an axis corresponding to a tangent to said top while taking said top as an origin, the surface shape of said reflection surface is represented by a function $Z(y)$; and
wherein equations (1) and (2) below are substantially satisfied:

$$1/\rho = \{l_{12}/[l_{23}(l_{12} + l_{23})] \cdot C - (l_{12} + l_{23})/(l_{12} \cdot l_{23})\} \times \sin\theta/2 \quad (1)$$

$$C = I/I_0 \cdot [1 + (l_{23}/l_{12})(1 + 2l_{12}/\rho_0 \sin\theta)] \times (l_{12} + l_{23})/l_{12} \quad (2)$$

where $\rho$ is the curvature radius at each point on the reflection surface of said mirror along the coordinate, $\theta$ is the angle of incidence of each X-ray beam impinging on each point on the reflection surface of said mirror along the coordinate, $l_{12}$ is the distance between the emission center of said radiation source and each point on the reflection surface of said mirror along the coordinate, $l_{23}$ is the distance between each point on the reflection surface of said mirror along the coordinate and the point of incidence on the resist of each beam reflected by each point on the reflection surface, and I is the quantity of each X-ray beam as reflected by each point on the reflection surface and absorbed by the resist, as the resist is exposed with the X-rays reflected by the cylindrical reflection surface with a curvature radius $\rho_0$, which corresponds to a basic curved surface on which the reflection surface of said mirror is based.

7. An exposure apparatus for exposing a resist on a substrate with an X-ray beam emitted from a radiation source and passed through a pattern of an original, said apparatus comprising:
a convex mirror for expanding, by reflection, the X-ray beam from the radiation source in size with respect to a predetermined sectional plane for illumination of the original,
wherein said convex mirror comprises a reflection surface having an aspherical shape including a predetermined curvature radius distribution with respect to the predetermined sectional plane, and wherein, near a top of said reflection surface, the surface shape is so asymmetrical with respect to the top that the radius of curvature of a portion at one side of the top near the radiation source is smaller than the radius of curvature of another portion at the other side of the top near the original.

8. An apparatus according to claim 7, wherein said radiation source comprises a synchrotron radiation source.

9. An apparatus according to claim 8, wherein, near the top, said reflection surface has a radius of curvature $\rho_0$;

wherein a set quantity of an X-ray beam reflected by the top and then adsorbed by the resist is $I_0$;

wherein, when a y coordinate is defined along an axis corresponding to a tangent to the top while taking the top as an origin, the surface shape of said reflection surface is represented by a function $Z(y)$; and wherein equations (1)–(5) below are substantially satisfied:

$$Z(y) = Z_0(y) + K(Z_p(y) - Z_0(y)) \quad (1)$$

$$0 < K \leq 1.5 \quad (2)$$

$$1/\rho = \{l_{12}/[l_{23}(l_{12} + l_{23})] \cdot C - (l_{12} + l_{23})/(l_{12} \cdot l_{23})\} \times \sin\theta/2 \quad (3)$$

$$C = I/I_0 \cdot [1 + (l_{23}/l_{12})(1 + 2l_{12}/\rho_0\sin\theta)] \times (l_{12} + l_{23})/l_{12} \quad (4)$$

$$Z_0(y) = \sqrt{\rho_0^2 - y^2} - \rho_0 \quad (5)$$

where $Z_0(y)$ is the function which represents the surface shape of a cylindrical reflection surface of a curvature radius $\rho_0$, corresponding to a basic curved surface on which the reflection surface of said mirror is based, $Z_p(y)$ is a function which represents the surface shape of the reflection surface of said mirror that substantially satisfies the conditions (3) and (4), $\rho$ is the curvature radius at each point on the reflection surface of said mirror along the coordinate, $\theta$ is the angle of incidence of each X-ray beam impinging on each point on the reflection surface of said mirror along the coordinate, $l_{12}$ is the distance between the emission center of the radiation source and each point on the reflection surface of said mirror along the coordinate, $l_{23}$ is the distance between each point on the reflection surface of said mirror along the coordinate and the point of incidence on the resist of each beam reflected by each point on the reflection surface, and I is the quantity of each X-ray beam reflected by each point on the reflection surface along the coordinate and absorbed by the resist, as the resist is exposed with the X-rays reflected by the reflection surface having a surface shape of $Z_0(y)$.

10. A semiconductor device manufacturing method for exposing a resist on a wafer with an X-ray beam emitted from a radiation source and passed through a circuit pattern of a mask, said method comprising:

expanding the X-ray beam from the radiation source in size with respect to a predetermined sectional plane by reflection with a convex mirror for illumination of the mask; and providing the convex mirror with a reflection surface having an aspherical shape including a predetermined curvature radius distribution with respect to the predetermined sectional plane, wherein, near a top of the reflection surface of the convex mirror, the surface shape is so asymmetrical with respect to the top that the radius of curvature of a portion at one side of the top near the radiation source is smaller than the radius of curvature of another portion at the other side of the top near the original.

11. A method according to claim 10, further comprising using a synchrotron radiation source as the radiation source.

12. A semiconductor device manufacturing method for exposing a resist on a wafer with an X-ray beam emitted from a radiation source and passed through a circuit pattern of a mask, said method comprising:

expanding the X-ray beam from the radiation source in size with respect to a predetermined sectional plane by reflection with a convex mirror for illumination of the mask; and providing the convex mirror with a reflection surface having an aspherical shape including a predetermined curvature radius distribution with respect to the predetermined sectional plane, wherein, near a top of the reflection surface of the convex mirror, the surface shape is so asymmetrical with respect to the top that the radius of curvature of a portion at one side of the top near the radiation source is smaller than the radius of curvature of another portion at the other side of the top near the original, and with respect to the predetermined sectional plane, the radius of curvature of a peripheral portion of the reflection surface remote from the top is larger than that of a portion of the reflection surface near the top.

13. A method according to claim 12, further comprising using a synchrotron radiation source as the radiation source.

14. A method according to claim 13, wherein, near the top, the reflection surface has a radius of curvature $\rho_0$;

wherein a set quantity of an X-ray beam reflected by the top and then absorbed by the resist is $I_0$;

wherein, when a y coordinate is defined along an axis corresponding to a tangent to the top while taking the top as an origin, the surface shape of the reflection surface is represented by a function $Z(y)$; and wherein equations (1)–(5) below are substantially satisfied:

$$Z(y) = Z_0(y) + K(Z_p(y) - Z_0(y)) \quad (1)$$

$$0 < K \leq 1.5 \quad (2)$$

$$1/\rho = \{l_{12}/[l_{23}(l_{12} + l_{23})] \cdot C - (l_{12} + l_{23})/(l_{12} \cdot l_{23})\} \times \sin\theta/2 \quad (3)$$

$$C = I/I_0 \cdot [1 + (l_{23}/l_{12})(1 + 2l_{12}/\rho_0\sin\theta)] \times (l_{12} + l_{23})/l_{12} \quad (4)$$

$$Z_0(y) = \sqrt{\rho_0^2 - y^2} - \rho_0 \quad (5)$$

where $Z_0(y)$ is the function which represents the surface shape of a cylindrical reflection surface of a curvature radius $\rho_0$, corresponding to a basic curved surface on which the reflection surface of the mirror is based, $Z_p(y)$ is a function which represents the surface shape of the reflection surface of the mirror that substantially satisfies the conditions (3) and (4), $\rho$ is the curvature radius at each point on the reflection surface of the mirror along the coordinate, $\theta$ is the angle of incidence of each X-ray beam impinging on each point on the reflection surface of the mirror along the coordinate, $l_{12}$ is the distance between the emission center of the radiation source and each point on the reflection surface of the mirror along the coordinate, $l_{23}$ is the distance between each point on the reflection surface of the mirror along the coordinate and the point of incidence on the resist of each beam reflected by each point on the reflection surface, and I is the quantity of each X-ray beam reflected by each point on the reflection surface along the coordinate and absorbed by the resist, as the resist is exposed with the X-rays reflected by the reflection surface having a surface shape of $Z_0(y)$.

15. An exposure apparatus for exposing an original having a pattern with an X-ray beam from a radiation source and for exposing a resist on a substrate with the X-ray beam from the original, said apparatus comprising:

a convex mirror for expanding, by reflection, the X-ray beam from the radiation source in size with respect to a predetermined sectional plane, wherein said convex mirror comprises a reflection surface having an aspherical shape including a predetermined curvature radius distribution with respect to the predetermined sectional plane, and wherein, near a top of said reflection surface of said convex mirror, the surface shape is so asymmetrical with respect to the top that the radius of curvature of a portion at one side of the top near the radiation source is smaller than the radius of curvature of another portion at the other side of the top near the original and, with respect to the predetermined sectional plane, the radius of curvature of a peripheral portion of the reflection surface remote from the top is larger than that of a portion of said reflection surface near the top.

16. An apparatus according to claim 15, wherein said radiation source comprises a synchrotron radiation source.

17. An apparatus according to claim 16, wherein, near the top, said reflection surface has a radius of curvature $\rho_0$;

wherein a set quantity of an X-ray beam reflected by the top and then absorbed by the resist is $I_0$;

wherein, when a y coordinate is defined along an axis corresponding to a tangent to the top while taking the top as an origin, the surface shape of said reflection surface is represented by a function $Z(y)$; and wherein equations (1)–(5) below are substantially satisfied:

$$Z(y) = Z_0(y) + K(Z\rho(y) - Z_0(y)) \qquad (1)$$

$$0 < K \leq 1.5 \qquad (2)$$

$$1/\rho = \{l_{12}/[l_{23}(l_{12} + l_{23})] \cdot C - (l_{12} + l_{23})/(l_{12} \cdot l_{23})\} \times \sin\theta/2 \qquad (3)$$

$$C = I/I_0 \cdot [1 + (l_{23}/l_{12})(1 + 2l_{12}/\rho\sin\theta)] \times (l_{12} + l_{23})/l_{12} \qquad (4)$$

$$Z_0(y) = \sqrt{\rho_0^2 - y^2} - \rho_0 \qquad (5)$$

where $Z_0(y)$ is the function which represents the surface shape of a cylindrical reflection surface of a curvature radius $\rho_0$, corresponding to a basic curved surface on which the reflection surface of said mirror is based, $Z_\rho(y)$ is a function which represents the surface shape of the reflection surface of said mirror that substantially satisfies the conditions (3) and (4), $\rho$ is the curvature radius at each point on the reflection surface of said mirror along the coordinate, $\theta$ is the angle of incidence of each X-ray beam impinging on each point on the reflection surface of said mirror along the coordinate, $l_{12}$ is the distance between the emission center of the radiation source and each point on the reflection surface of said mirror along the coordinate, $l_{23}$ is the distance between each point on the reflection surface of said mirror along the coordinate and the point of incidence on the resist of each beam reflected by each point on the reflection surface, and I is the quantity of each X-ray beam reflected by each point on the reflection surface along the coordinate and absorbed by the resist, as the resist is exposed with the X-rays reflected by the reflection surface having a surface shape of $Z_0(y)$.

* * * * *

UNITED STATES PATENT AND TRADEMARK OFFICE
CERTIFICATE OF CORRECTION

PATENT NO. : 5,123,036
DATED : June 16, 1992
INVENTOR(S) : Shinichiro Uno, et al.

Page 1 of 2

It is certified that error appears in the above-identified patent and that said Letters Patent is hereby corrected as shown below:

IN THE DRAWINGS

IN FIGURE 7

"(SYLINDRICAL" should read --(CYLINDRICAL--.

COLUMN 5

Line 50, "X-ray 6" should read --X-rays 6--; and
Line 59, "X-ray" should read --X-rays--.

UNITED STATES PATENT AND TRADEMARK OFFICE
CERTIFICATE OF CORRECTION

PATENT NO. : 5,123,036

DATED : June 16, 1992

INVENTOR(S) : Shinichiro Uno, et al.

It is certified that error appears in the above-identified patent and that said Letters Patent is hereby corrected as shown below:

Column 9

Line 8, "$z_0(Y)$" should read --$Z_0(Y)$--.

Signed and Sealed this

Tenth Day of August, 1993

Attest:

MICHAEL K. KIRK

*Attesting Officer*   *Acting Commissioner of Patents and Trademarks*